United States Patent [19]
Fan

[11] Patent Number: 5,269,899
[45] Date of Patent: Dec. 14, 1993

[54] CATHODE ASSEMBLY FOR CATHODIC SPUTTERING APPARATUS

[75] Inventor: Jia S. Fan, Columbus, Ohio

[73] Assignee: Tosoh SMD, Inc., Grove City, Ohio

[21] Appl. No.: 875,967

[22] Filed: Apr. 29, 1992

[51] Int. Cl.$^5$ .............................................. C23C 14/34
[52] U.S. Cl. ........................... 204/298.09; 204/192.12; 204/298.12
[58] Field of Search ..................... 204/192.12, 298.09, 204/298.12, 298.15, 298.19

[56] References Cited

U.S. PATENT DOCUMENTS

| | | | |
|---|---|---|---|
| 3,741,886 | 6/1973 | Urbanek et al. | 204/298 |
| 3,749,662 | 7/1973 | Biehl | 204/298 |
| 4,014,779 | 3/1977 | Kuehnle | 204/298 |
| 4,060,470 | 11/1977 | Clarke | 204/192 |
| 4,100,055 | 7/1978 | Rainey | 204/298 |
| 4,169,031 | 9/1979 | Brors | 204/192 |
| 4,198,283 | 4/1980 | Class et al. | 204/298 |
| 4,204,936 | 5/1980 | Hartsough | 204/192 |
| 4,290,876 | 9/1981 | Nishiyama et al. | 204/298 |
| 4,324,631 | 4/1982 | Meckel et al. | 204/192 |
| 4,385,979 | 5/1983 | Pierce et al. | 204/298 |
| 4,430,190 | 2/1984 | Eilers et al. | 204/298 |
| 4,457,825 | 7/1984 | Lamont, Jr. | 204/298 |
| 4,500,409 | 2/1985 | Boyd et al. | 204/298 |
| 4,564,435 | 1/1986 | Wickersham | 204/298 |
| 4,569,745 | 2/1986 | Nagashima | 204/298 |
| 4,657,654 | 4/1987 | Mintz | 204/298 |
| 4,668,373 | 5/1987 | Rille et al. | 204/298 |
| 4,820,397 | 4/1989 | Fielder et al. | 204/298 |
| 4,826,584 | 5/1989 | Ribeiro | 204/298 |
| 4,855,033 | 8/1989 | Hurwitt | 204/298 |
| 4,885,075 | 12/1989 | Hillman | 204/298 |
| 5,009,765 | 4/1991 | Qamar et al. | 204/298 |
| 5,021,139 | 6/1991 | Hartig et al. | 204/298.09 |
| 5,071,535 | 12/1991 | Hartig et al. | 204/298.09 |

FOREIGN PATENT DOCUMENTS

| | | |
|---|---|---|
| 0276962 | 8/1988 | European Pat. Off. . |
| 0393344 | 10/1990 | European Pat. Off. ....... 204/298.09 |
| 215484 | 5/1983 | Japan . |
| 279672 | 12/1986 | Japan . |

OTHER PUBLICATIONS

"The Construction of Small Planar Magnetrons for Sputtering Use," C. Elphick, Vacuum, vol. 31, pp. 5-7, 1981.

Primary Examiner—Nam Nguyen
Attorney, Agent, or Firm—Biebel & French

[57] ABSTRACT

Elastic and plastic deformation of backing plate members in target-backing plate cathode assemblies for cathodic sputter coating apparatus are minimized by the provision of a concave surface portion located at the target/backing plate interface and by provision of a backing plate material having a yield strength of at least about 35 ksi.

15 Claims, 6 Drawing Sheets

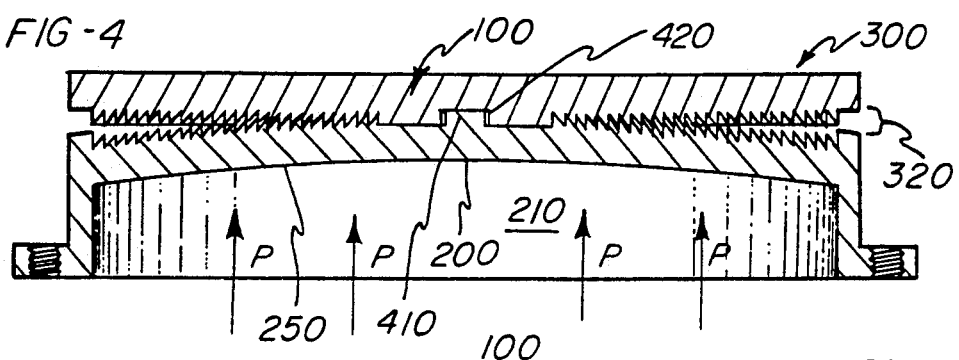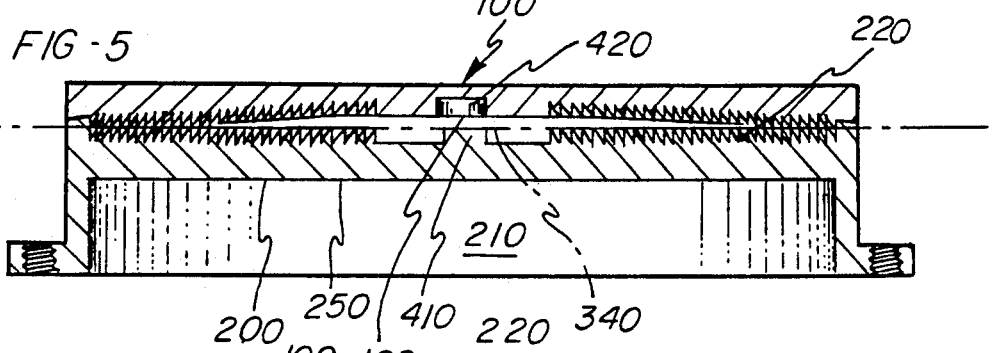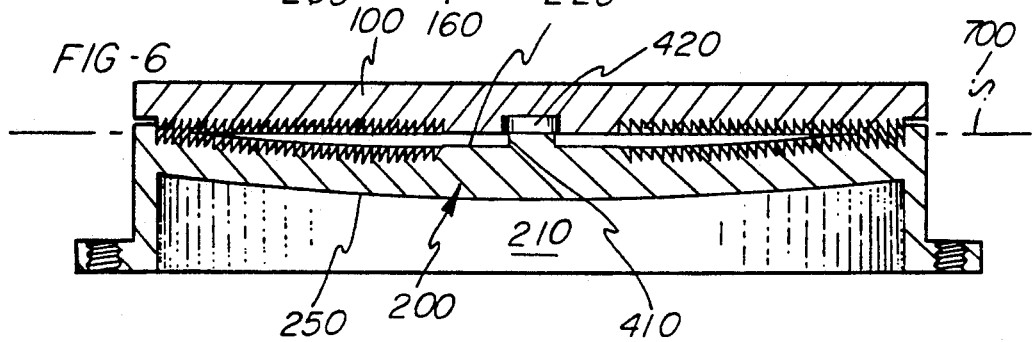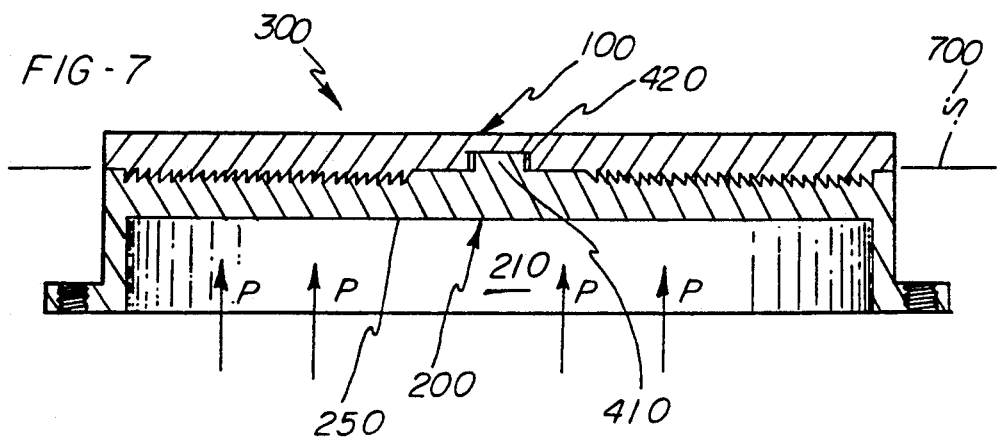

CATHODE ASSEMBLY FOR CATHODIC SPUTTERING APPARATUS

Field of the Invention

The present invention pertains to an easily mounted sputter target and associated backing plate that are useful in a cathodic sputter coating assembly.

BACKGROUND OF THE INVENTION

Cathodic sputtering is widely used for the deposition of thin layers of material onto desired substrates. Basically, this process requires a gas ion bombardment of the target having a face formed of a desired material that is to be deposited as a thin film or layer on a substrate. Ion bombardment of the target not only causes atoms or molecules of the target material to be sputtered, but imparts considerable thermal energy to the target. This heat is dissipated by use of a cooling fluid typically circulated beneath or around a backing plate that is positioned in heat exchange relation with the target.

The target forms a part of a cathode assembly which together with an anode is placed in an evacuated chamber that contains an inert gas, preferably argon. A high voltage electrical field is applied across the cathode and anode. The inert gas is ionized by collision with the electrons ejected from the cathode. Positively charged gas ions are attracted to the cathode and, upon impingement with the target surface, dislodge the target material. The dislodged target materials traverse the evacuated enclosure and deposit as a thin film on the desired substrate that is normally located proximate the anode.

In addition to the use of an electrical field, increasing sputtering rates have been achieved by the concurrent use of an arch-shaped magnetic field that is superimposed over the electrical field and formed in a closed loop configuration over the surface of the target. These methods are known as magnetron sputtering methods. The arch-shaped magnetic field traps electrons in an annular region adjacent the target surface thereby increasing the number of electron-gas atom collisions in the area to produce an increase in the number of positively charged gas ions in the region that strike the target to dislodge the target material. Accordingly, the target material becomes eroded (i.e., consumed for subsequent deposition on the substrate) in a generally annular section of the target face, known as the target raceway.

In conventional target cathode assemblies, the target is attached to a nonmagnetic backing plate. The backing plate is normally water-cooled to carry away the heat generated by the ion bombardment of the target. Magnets are typically arranged beneath the backing plate in well-known dispositions in order to form the above-noted magnetic field in the form of a loop or tunnel extending around the exposed face of the target.

In order to achieve good thermal and electrical contact between the target and the backing plate, these members are commonly attached to a support by use of soldering, brazing, diffusion bonding, clamping, epoxy cements, or with interlocking annular members.

For example, the prior art shown in the Hillman Pat. No. 4,885,075 discloses a cooling device for a sputter target and source utilizing an annular shape member of high thermal conductivity disposed between the cathode and the target electrode. This annular member is constructed of a base that is disposed in a corresponding recess in the cathode and a member projecting perpendicularly from the base disposed in a corresponding annular-shaped recess in the target electrode. Upon heating of the target, the target electrode expands radially against the members, thereby reducing the temperature of the target electrode.

A further example of the prior art is the Lamont Pat. No. 4,457,825 which discloses a sputtering assembly wherein a circular cathode ring surrounds a centrally located circular anode. The cathode ring as a sputter surface having a generally inverted conical configuration. The target is cooled by thermal contact between an outer rim of the target and a cooling wall disposed along the periphery of the outer rim of the target.

Other examples of cathodic sputtering target cooling assemblies include U.S. Pat. Nos. 4,060,470 (Clarke); 4,100,055 (Rainey); and 4,564,435 (Wickersham). In these types of structures, when the sputter target is at ambient temperatures, the target is slightly smaller in diameter than the cooling wall, and the target may move freely in the axial direction for easy insertion of same into the assembly. When the sputter target is in operation and heated, the target expands into close physical contact with the cooling wall. As a variation to this approach, U.S. Pat. No. 4,855,033 (Hurwitt) provides intermeshing projections and recesses formed in the target sidewall and surrounding cooling wall to improve heat transfer. Further, the target comprises an arch-shaped convex back portion so that plastic deformation of the target during sputtering will translate into a radially directed vector to urge the target sidewall into contact with the surrounding cooling wall.

One problem experienced with the prior art sputter target/backing plate assemblies taught in Hillman is that, during sputter usage, the backing plates warp or bow outwardly at the center, most probably due to cooling fluid pressure exerted along the underside portion of the backing plate, causing disengagement of the projections and recesses of the coupling means. This, in turn, severely retards heat transfer, leading to target deterioration and failure.

Accordingly, it is an object of the invention to provide a readily mounted mating target/backing plate structure that accommodates this bowing tendency, thus acting to maintain coupling of the target-backing plate. The ideal combination would employ a means for providing an easy change from one target to the next, while ensuring efficient thermal contact between the backing plate and target.

SUMMARY OF THE INVENTION

The present invention provides a target that is readily mounted to a backing plate structure without need of solder, brazing, or clamps and the like, with the backing plate or target having a concave surface to compensate for the aforementioned bowing of the backing plate. The concave surface of either the backing plate or target mating surfaces compensates for the warping or bowing of the backing plate to maintain the coupled relation of these two members thus enhancing heat exchange between the target and the backing plate.

Annularly disposed teeth provided on the underneath target side mesh with annularly arranged teeth provided on the mating, top backing plate side, thereby increasing the effective target-backing plate heat exchange surface area. The increased surface area enhances the heat exchange from the target to the backing plate thereby allowing maintenance of the desired temperature of the target during sputtering operation.

During a typical operation of the preferred embodiment of the invention, the assembly target is placed over the backing plate and a slight torque applied to one of the pieces relative to the other to ensure a friction fit of the target and backing plate due to the mating teeth on the target and backing plate mating surfaces and the provision of a central post member and corresponding recess formed respectively in the backing plate and target. The assembly is evacuated and sputtering conditions commenced. The heat generated during the sputtering causes the target (typically composed of aluminum) to radially expand and make even better thermal contact with the mating teeth formed on the backing plate.

Water or other cooling fluid pressure on the backing plate causes the concave face surface of the backing plate to become substantially planar with respect to the mating surface of the target. This structure provides reliable control of the operating temperature of the target. Once the target is consumed, the used target is simply removed by application of a slight torque to one of the pieces to allow lifting of the target from its mating backing plate.

The invention will be further described in conjunction with the appended drawings and following detailed description.

BRIEF DESCRIPTION OF THE DRAWINGS

FIGS. 1A and 1B are, respectively, cut-away magnified views showing the teeth formed on the mating surfaces of the target and backing plate, respectively;

FIG. 4 is a cross-sectional view of a target and backing plate assembly, highlighting the bowing problem experienced in some prior art assemblies;

FIG. 5 is a cross-sectional view of an assembly in accordance with the invention wherein the bottom side of the target is provided with a concave back surface and wherein the backing plate comprises a planar top surface so as to compensate for the aforementioned bowing problem;

FIG. 6 is a cross-sectional view of the preferred embodiment of the invention wherein the backing plate surface adapted for mating with the target comprises a concave surface;

FIG. 7 is a cross-sectional view of the assembly, shown in FIG. 6, during sputtering operation illustrating maintenance of the engaged disposition of target and backing plate;

DETAILED DESCRIPTION OF THE PREFERRED EMBODIMENT

Figure 1:
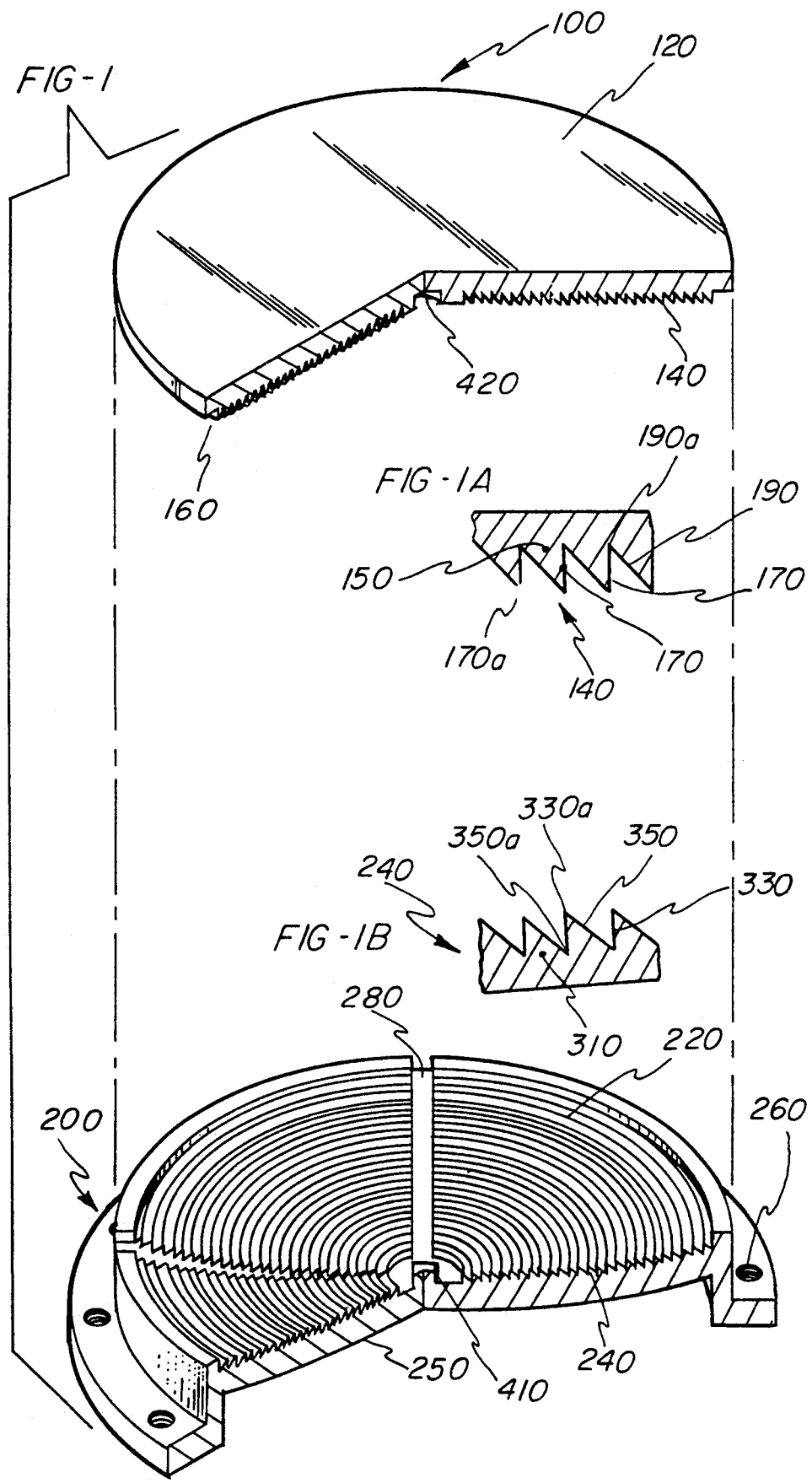
FIG. 1 is a perspective view of a target and backing plate assembly in accordance with the invention.

In accordance with the invention, and with specific reference to FIG. 1, there is shown a cathode assembly comprising target 100 and mating backing plate 200. The target 100 is of a disc-like shape and comprises a face 12 formed from the desired metal, such as aluminum, that is to be sputter-coated onto a desired substrate.

Underside portion 160 of target 100 is provided with a plurality of teeth 140 that are annularly disposed in a plurality of concentrically arranged rows. These annularly disposed teeth 140 are adapted to engage with the annularly disposed teeth 240 provided in concentrically arranged rows on the front surface 220 of backing plate 200.

As is well-known in the art, the backing plate 200 is normally constructed of a highly thermally conductive material, such as copper and is positioned in heat exchange relation with a cooling medium, such as water which contacts bottom surface 250 of the backing plate to effect heat transfer from the target during sputtering. Generally, the thermal conductor material has been oxygen-free copper (OFC). Details of the manner in which such a cooling medium may be provided are well-known in the art and need not be discussed herein. One acceptable cooling arrangement is shown in U.S. Pat. No. 4,198,283 (Clarke et al) incorporated by reference herein.

Referring again to FIG. 1, the backing plate 200 is provided with a plurality of threaded bores 260 to provide attachment of plate 200 to associated cathodic sputter structure. Again, details of the sputter chamber and structure are not germane to the present invention and need not be discussed herein. One skilled in the art will appreciate that a variety of sputter chambers and associated structures can be used with the present invention, including those specified in the aforementioned Clarke et al patent or the Boys et al, U.S. Pat. No. 4,500,409. It is also noted here that although the invention is depicted in conjunction with a circularly shaped target, it can be readily used with other shapes, such as rectangular shapes and even conically-shaped cathode targets of the type shown in U.S. Pat. No. 4,457,825 issued to Lamont, Jr.

Underside surface 160 of the target 100 is placed on top of the front surface 220 of backing plate 200 and a slight torque is applied to the target 10 relative to the backing plate 200 to effect friction engagement of the teeth 140 and 240 and a centrally located port member 410 formed in the backing plate and a corresponding recess 420 milled in the target. This meshing of the annular teeth and the post and recess couples the target 100 to the backing plate 200 and provides convenient disassembly of the target 100 from the backing plate 200. As shown in FIG. 1, in order to compensate for the heretofore experienced bowing of the backing plate, the surface 220 is concave or dish-like. Most preferably, the curvature of surface 220 is parabolic.

Annular rows 150 of teeth 140 are shown in FIG. 1A. Each set of teeth 140 comprises an upstanding normal wall member 170 that extends perpendicularly with respect to the plane of surface 160, terminating at crest 170a. Member 170 is connected to inclined surface 190 at root 190a through an acute angle of approximately 45°. The distance between neighboring rows of teeth 140 as measured from one normal wall member 170 to its neighboring wall member 170 is denoted as $R_t$.

Teeth 240 shown in FIG. 1B are also provided in a plurality of annular rows 310. Each set of teeth 240 comprises an upstanding normal wall member 330 that extends perpendicularly with respect to the surface 220, terminating at crest 330a. Each member 330 is connected to inclined surface 350 at root 350a through an acute angle of approximately 45°. The distance between neighboring rows of teeth 240 as measured from the normal wall member to its neighboring wall member 330 is denoted as $R_{bp}$. Typically, $R_t$ is slightly smaller than $R_{bp}$ so that thermal expansion during sputtering will expand $R_t$ causing tighter engagement and increasing effectiveness in heat transfer. The gap between $R_t$ and $R_{bp}$ is most preferably 0.010 inches.

Structure of the teeth as shown in FIGS. 1A and 1B provides for increased surface area contact of the heat transfer surfaces and also provides a design that can be readily milled.

Figure 2:
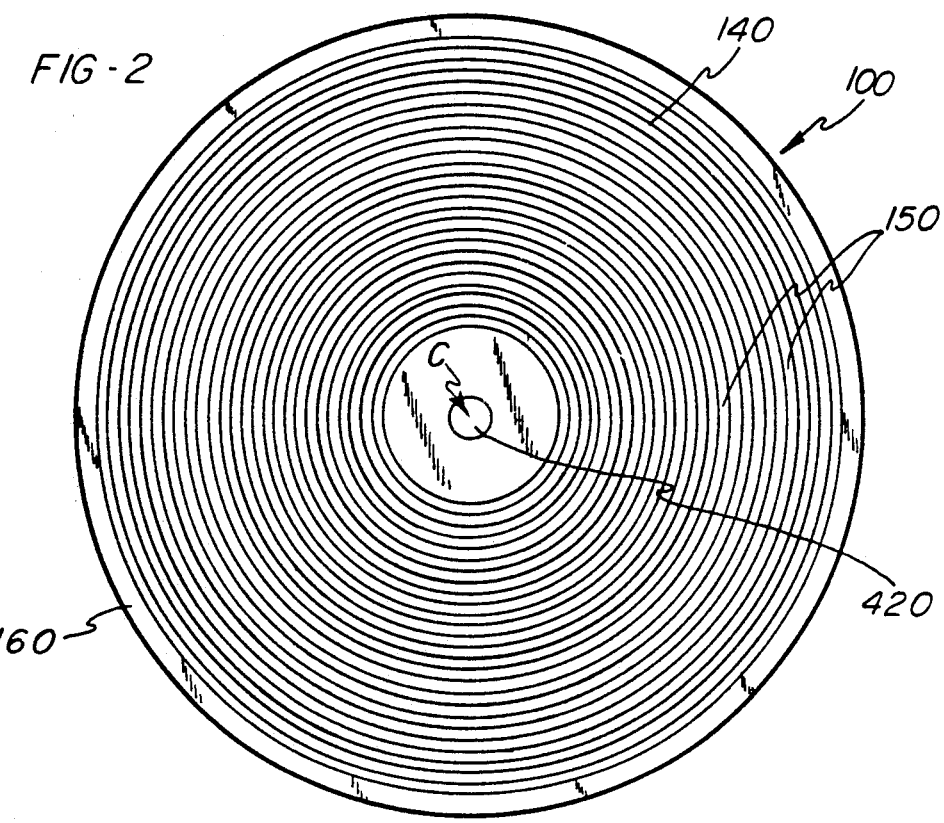
FIG. 2 is a bottom planar view of the target surface adapted to mate with a backing plate.
Figure 3:
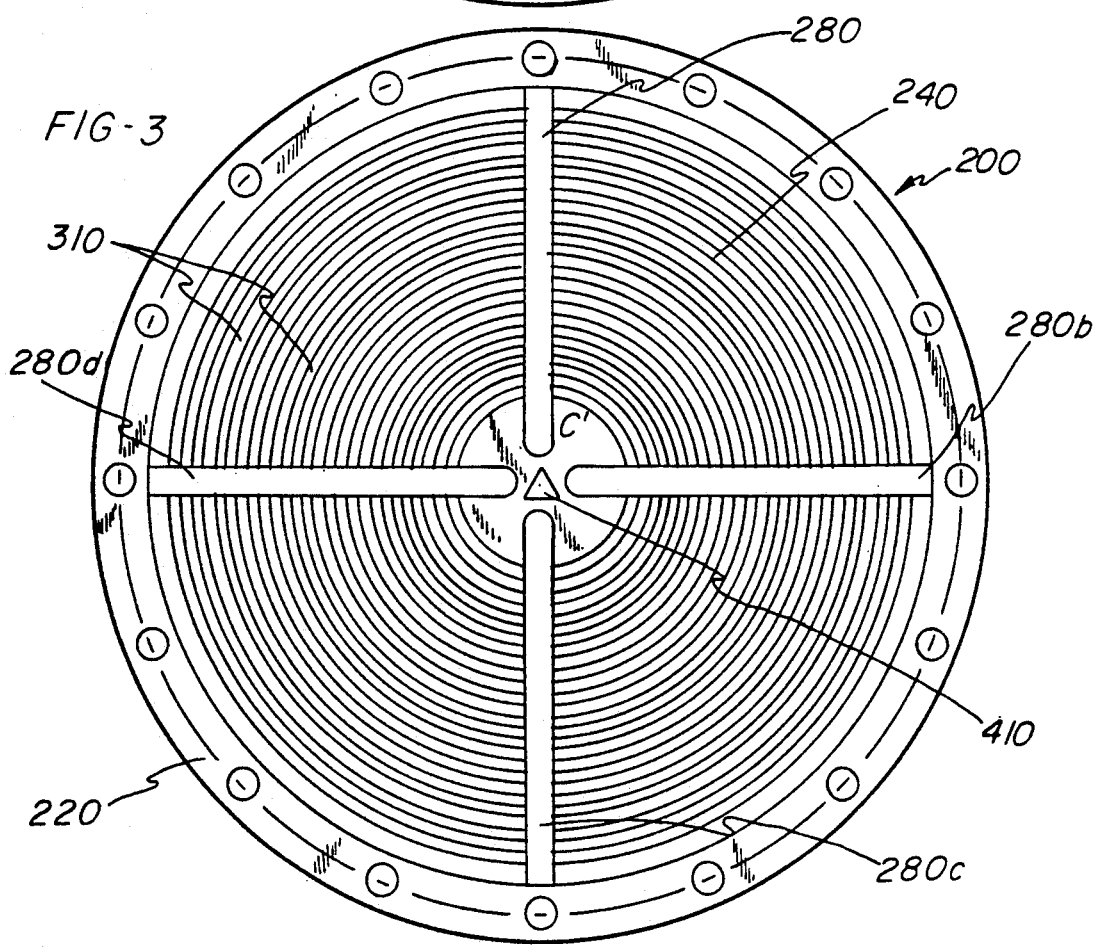
FIG. 3 is a top planar view of the backing plate surface.

Now referring to FIGS. 2 and 3, it can be seen that teeth 140 and 240 are annularly disposed around the target and backing plate in rows 150, 310, respectively, with the rows concentrically arranged around the axes C and C' of the mating target 100 and backing plate 200. One skilled in the art will appreciate that, although the teeth 140 and 240 are specifically depicted in FIGS. 1A and 1B herein as being generally triangular in cross-section, other cross-sectional shapes can be implemented as long as they provide for coupling engagement of the backing plate and target. Post member 410 is located at the axis of backing plate with recess 420 located in the center of target to improve mating cooperation of the target and backing plate.

Evacuation channels 280a, 280b, 280c, and 280d are formed in backing plate 200 to provide convenient location for attachment of a suction source to evacuate air from the target 100—backing plate 200 interface. Additionally, the channels 280 provide location for the placement of a thermocouple or the like at the interface, if desired.

Now referring to FIG. 4, there is shown a cathode assembly 300 in sputtering operation with the target 100 superposed over the backing plate 200. This depicted assembly is representative of the bowing problem that may be experienced in some prior art cathode assemblies. As shown, water pressure P in the cooling jacket 210 deforms back side 250 of the backing plate 200. Deformation stress caused by the water pressures bows backing plate 200, thereby causing the adjacent surfaces of the target 100 and backing plate 200 to separate from their once mated cooperation. It is noted that the degree of bowing of the backing plate is exaggerated in the figures in order to better illustrate this occurrence. The separation forms gap 320 and inhibits effective heat exchange between the target 100 and the backing plate 200. Target 100 therefore attains undesirably high temperatures during sputtering, leading to target deterioration and failure.

Generally, the degree of bowing of the backing plate 200 is dependent upon the water pressure applied in the cooling jacket 210. Thus, the greater the water pressure the greater the degree of bowing. In most instances, water in the cooling jacket is maintained at from about 30 to 45 psi.

The backing plate 200 depicted in FIG. 4 has not been constructed or designed to compensate for any deformation caused by water pressure behind the backing plate 200. Thus it is desired that the backing plate or target 100 be designed such that this deformation is taken into account to maintain the appropriate heat exchange relationship from the target 10 to the backing plate 200.

Now referring to FIG. 5, there is shown one embodiment of the invention wherein the target 100 comprises back surface 160 having a generally concave surface with the front mating surface 220 of the backing plate being planar. This concave shape of the target 100 compensates for the deformation of the backing plate 200 during operation such that the annularly disposed teeth 140 of the target 100 maintain meshing engagement with the annular teeth 240 of the backing plate 200 during sputtering, thereby maintaining the desired level of heat exchange between the target 100 and backing plate 200. Most preferably, the cross-sectional shape of the concavity on surface 160 is parabolic.

Now referring to FIG. 6, there is shown the preferred embodiment of the invention wherein the front surface 220 of the backing plate is concave to compensate for the elastic deformation of the backing plate 200 during operation or sputtering. Again, as stated above, the degree of the concavity is such that in operation the backing plate will expand so that its center will lie upon plane 700 and completely mesh with the annular teeth 140 of the back surface of the planar teeth 100.

It can be appreciated that either back surface 160 of the target, as stated above, or the front surface 220 of the backing plate, as stated above, will have a concave and parabolic shape to compensate for this elastic deformation. The provision of a concave face backing plate is greatly preferred, however, since the target is more frequently replaced; and therefore, frequent change of a concave back target would increase the costs associated with realizing the benefits of the invention.

FIG. 7 shows the assembled combination of FIG. 6 during sputtering use, wherein backing plate 200 meshes with the target substantially along plane 700.

Figure 8:
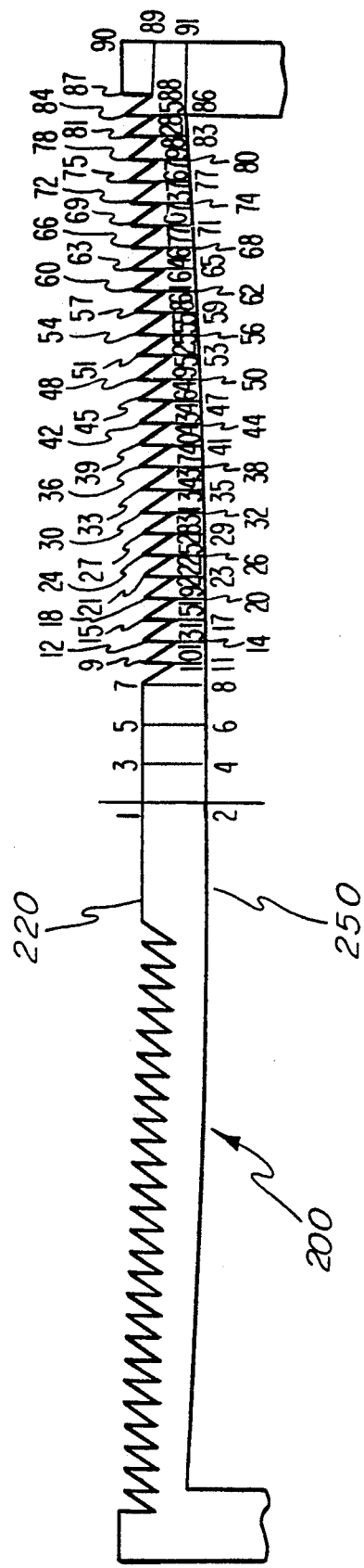
FIG. 8 is a schematic depiction showing the location of reference numbers corresponding to key points along the concave surface of a preferred backing plate in accordance with the invention.

FIG. 8 provides a graphical representation showing reference numbering of key points located along the cross-section of a 10" diameter concave face backing plate in accordance with the preferred embodiment of the invention. Reference numbers 1–91 are given to these key points. For example, reference number 1 is given for the center of the backing plate at its face 220 with reference number 2 representative of the central location, bottom side 250 of the backing plate. Reference numbers 7, 9, 12, 15, 18, 21, 24, 27, 30, 33, 36, 39, 42, 45, 48, 51, 54, 57, 60, 63, 66, 69, 72, 75, 78, 81, 84, and 87 each present crests 330a of the annular rows 240 of teeth on front surface 220 of the backing plate as the rows progress radially from the center of the backing plate toward its circumference. Reference numbers 10, 13, 16, 19, 22, 25, 28, 31, 34, 37, 40, 43, 46, 49, 52, 55, 58, 61, 64, 67, 70, 73, 76, 79, 82, 85 and 88 each represent roots 350a of the annular rows 240 of teeth on the front surface 220 of the backing plate as the roots progress in rows, radially outwardly from the center of the backing plate to its circumference. Reference numbers 2, 4, 6, 8, 11, 14, 17, 20, 23, 26, 29, 32, 35, 38, 41, 44, 47, 50, 53, 56, 59, 62, 65, 68, 71, 74, 77, 80, 83, and 86 and 91 represent key points along the underside 221 of the backing plate extending radially from the center of the backing plate to its circumference.

In accordance with the invention, and based upon deformational studies conducted to data with planar faced backing plates under various water pressure deformational stresses, cartesian coordinates can be assigned for each of the reference numbers (i.e., key points) in the backing plate 200 by Finite Element Analysis. Once these coordinates are known, the appropriate cross-sectional shape of the backing plate can be milled by use of a computer numerical control (CNC) milling machine.

Key position coordinates for a backing plate subjected to 30 psi and 45 psi deformation are reported in Tables I and II. The x direction gives radial dimension (i.e., measured from the center of the backing plate radially towards its circumference) with the y coordinates indicating the axial (thickness) direction of the backing plate. In the y direction, negative numbers indicate the dimension measured away from the planar (y=0) position. Planarity is indicated by the dot dash line 700 in FIG. 6.

TABLE I

Cartesian Coordinates Concave Face Backing Plate 30 psi Water Pressure

| x direction (cm) | y direction (cm) | | Reference Number |
|---|---|---|---|
| 0 | −0.16229502 | −0.79730932 | 1   2 |
| 1.26930755 | −0.16063613 | | 3 |
| 1.2709417419 | | −0.79569221 | 4 |
| 2.53854715 | −0.15583255 | | 5 |
| 2.5417223764 | | −0.79084871 | 6 |
| 3.808104725 | −0.1480613 | | 7 |
| 3.8126139395 | | −0.78316107 | 8 |
| 4.128006807 | −0.4632804 | | 10 |
| 4.125412308 | −0.14560732 | | 9 |
| 4.131017308 | | −0.78065768 | 11 |
| 4.4457902884 | −0.46025196 | | 13 |
| 4.44244321 | −0.14257809 | | 12 |
| 4.449463686 | | −0.7770637 | 14 |
| 4.7635494 | −0.45656018 | | 16 |
| 4.759534351 | −0.13888824 | | 15 |
| 4.767873391 | | −0.7739978 | 17 |
| 5.0812830619 | −0.45221782 | | 19 |
| 5.076661006 | −0.13454841 | | 18 |
| 5.0861826959 | | −0.76966376 | 20 |
| 5.398995462 | −0.44730019 | | 22 |
| 5.393825335 | −0.12963442 | | 21 |
| 5.404418786 | | −0.76474801 | 23 |
| 5.716687986 | −0.44185946 | | 25 |
| 5.711024258 | −0.12419826 | | 24 |
| 5.722580531 | | −0.75931114 | 26 |
| 6.034361742 | −0.43595023 | | 28 |
| 6.028257491 | −0.11829459 | | 27 |
| 6.040671256 | | −0.75340557 | 29 |
| 6.3520171515 | −0.42962458 | | 31 |
| 6.345525067 | −0.11197573 | | 30 |
| 6.3586907646 | | −0.74708425 | 32 |
| 6.669554238 | −0.42293624 | | 34 |
| 6.66282776 | −0.10529464 | | 33 |
| 6.676637984 | | −0.74039997 | 35 |
| 6.987272682 | −0.415938402 | | 37 |
| 6.98016681 | −0.09830534 | | 36 |
| 6.994510631 | | −0.733406813 | 38 |
| 7.304871888 | −0.408687298 | | 40 |
| 7.297543879 | −0.091063814 | | 39 |
| 7.31230556 | | −0.726160734 | 41 |
| 7.6224520411 | −0.40124142 | | 43 |
| 7.614960973 | −0.083628585 | | 42 |
| 7.630018868 | | −0.718720257 | 44 |
| 7.940009132 | −0.393662345 | | 46 |
| 7.9324204 | −0.076061261 | | 45 |
| 7.947646008 | | −0.711146977 | 47 |
| 8.257544992 | −0.386015183 | | 49 |
| 8.249924735 | −0.068426989 | | 48 |
| 8.265181869 | | −0.703506028 | 50 |
| 8.575057309 | −0.378368988 | | 52 |
| 8.567476792 | −0.060794855 | | 51 |
| 8.582620834 | | −0.695866482 | 53 |
| 8.892544643 | −0.370797115 | | 55 |
| 8.885079602 | −0.053238251 | | 54 |
| 8.899956831 | | −0.688301714 | 56 |
| 9.210005439 | −0.363377549 | | 58 |

TABLE I-continued

Cartesian Coordinates Concave Face Backing Plate 30 psi Water Pressure

| x direction (cm) | y direction (cm) | | Reference Number |
|---|---|---|---|
| 9.202736401 | −0.045835201 | | 57 |
| 9.217183361 | | −0.680889733 | 59 |
| 9.527438038 | −0.356193225 | | 61 |
| 9.520450608 | −0.038668675 | | 60 |
| 9.534293568 | | −0.673713477 | 62 |
| 9.844840681 | −0.349332269 | | 64 |
| 9.838225835 | −0.031826842 | | 63 |
| 9.85128009 | | −0.666861145 | 65 |
| 10.162211509 | −0.342888413 | | 67 |
| 10.15606583 | −0.025403459 | | 66 |
| 10.168135707 | | −0.660426303 | 68 |
| 10.47954861 | −0.336960752 | | 70 |
| 10.47397463 | −0.019497717 | | 69 |
| 10.48485111 | | −0.654508724 | 71 |
| 10.79684986 | −0.331712565 | | 73 |
| 10.79195594 | −0.014215939 | | 72 |
| 10.80142294 | | −0.649212565 | 74 |
| 11.11411351 | −0.327081225 | | 76 |
| 11.11001545 | −0.009666651 | | 75 |
| 11.11782535 | | −0.644654006 | 77 |
| 11.431336123 | −0.323369232 | | 79 |
| 11.42815246 | −0.005979319 | | 78 |
| 11.434111525 | | −0.640934983 | 80 |
| 11.74851992 | −0.320594322 | | 82 |
| 11.74638973 | −0.003233692 | | 81 |
| 11.75004729 | | −0.636613253 | 83 |
| 12.065646485 | −0.319068608 | | 85 |
| 12.06466674 | −0.001613253 | | 84 |
| 12.0663021 | | −0.636487773 | 86 |
| 12.38302084 | −0.3184133 | | 88 |
| 12.38226181 | −0.000914618 | | 87 |
| 12.700447888 | −0.317922084 | | 89 |
| 12.69986541 | 0.0004245271 | | 90 |
| 12.700987961 | | −0.635511934 | 91 |

TABLE II

Cartesian Coordinates Concave Face Backing Plate 45 psi Water Pressure

| x direction (cm) | y direction (cm) | | Reference Number |
|---|---|---|---|
| 0 | −0.22131139 | −0.85633089 | 1   2 |
| 1.26905575 | −0.21904927 | | 3 |
| 1.2712841935 | | −0.85412574 | 4 |
| 2.538018841 | −0.21249893 | | 5 |
| 2.5423486159 | | −0.84752097 | 6 |
| 3.807415535 | −0.20190178 | | 7 |
| 3.813564463 | | −0.83703782 | 8 |
| 4.1281911 | −0.51629145 | | 10 |
| 4.124653148 | −0.19855544 | | 9 |
| 4.132296329 | | −0.83362411 | 11 |
| 4.446077666 | −0.51216177 | | 13 |
| 4.441513468 | −0.19442467 | | 12 |
| 4.451086845 | | −0.8295996 | 14 |
| 4.763931 | −0.50712751 | | 16 |
| 4.758455933 | −0.18939306 | | 15 |
| 4.769827351 | | −0.82454246 | 17 |
| 5.0817496299 | −0.50120612 | | 19 |
| 5.075446826 | −0.18347511 | | 18 |
| 5.088430949 | | −0.8186324 | 20 |
| 5.399539266 | −0.49450026 | | 22 |
| 5.392489093 | −0.17677421 | | 21 |
| 5.406934708 | | −0.8119291 | 23 |
| 5.7173018 | −0.48708108 | | 25 |
| 5.709578533 | −0.16936127 | | 24 |
| 5.725337088 | | −0.8045152 | 26 |
| 6.035038739 | −0.47902304 | | 28 |
| 6.02671476 | −0.1613108 | | 27 |
| 6.043642623 | | −0.79646214 | 29 |
| 6.3527506611 | −0.47039752 | | 31 |
| 6.343897818 | −0.15269417 | | 30 |
| 6.361851043 | | −0.78784216 | 32 |
| 6.670437598 | −0.46127668 | | 34 |
| 6.661128763 | −0.1435836 | | 33 |
| 6.679960888 | | −0.77872723 | 35 |
| 6.988099111 | −0.45173418 | | 37 |

TABLE II-continued
Cartesian Coordinates Concave Face Backing Plate 45 psi Water Pressure

| x direction (cm) | y direction (cm) | | Reference Number |
|---|---|---|---|
| 6.978409287 | −0.13405274 | | 36 |
| 6.997969043 | | −0.76919111 | 38 |
| 7.305734393 | −0.44184632 | | 40 |
| 7.295741653 | −0.12417793 | | 39 |
| 7.315871219 | | −0.75931009 | 41 |
| 7.6233423288 | −0.43169285 | | 43 |
| 7.613128599 | −0.11403898 | | 42 |
| 7.633662093 | | −0.74916399 | 44 |
| 7.940921543 | −0.42135774 | | 46 |
| 7.930573273 | −0.1037199 | | 45 |
| 7.951335466 | | −0.73883679 | 47 |
| 8.258470444 | −0.410929796 | | 49 |
| 8.248079184 | −0.09330953 | | 48 |
| 6.260975085 | | −0.728417311 | 50 |
| 8.575987239 | −0.400503166 | | 52 |
| 8.565650171 | −0.082902075 | | 51 |
| 8.586301137 | | −0.717999748 | 53 |
| 8.8934699678 | −0.390177884 | | 55 |
| 8.883290367 | −0.072597615 | | 54 |
| 8.903577498 | | −0.707684155 | 56 |
| 9.210916508 | −0.380060295 | | 58 |
| 9.201004183 | −0.062502547 | | 57 |
| 9.220704584 | | −0.697576908 | 59 |
| 9.528324597 | −0.370263488 | | 61 |
| 9.518796283 | −0.052730011 | | 60 |
| 9.537673048 | | −0.687791105 | 62 |
| 9.845691838 | −0.360907639 | | 64 |
| 9.836671593 | −0.043400239 | | 63 |
| 9.854472851 | | −0.678447016 | 65 |
| 10.163015695 | −0.352120563 | | 67 |
| 10.15463522 | −0.03464108 | | 66 |
| 10.171094147 | | −0.669672232 | 68 |
| 10.48029356 | −0.34403739 | | 70 |
| 10.47269267 | −0.026587796 | | 69 |
| 10.48752424 | | −0.661602806 | 71 |
| 10.79752254 | −0.336803338 | | 73 |
| 10.79084902 | −0.019385371 | | 72 |
| 10.80375855 | | −0.65438077 | 74 |
| 11.11470025 | −0.330565308 | | 76 |
| 11.10911197 | −0.013181797 | | 75 |
| 11.11976141 | | −0.648164555 | 77 |
| 11.43182987 | −0.325503498 | | 79 |
| 11.42748063 | −0.008153618 | | 78 |
| 11.435606625 | | −0.643093159 | 80 |
| 11.7488908 | −0.32171953 | | 82 |
| 11.745986 | −0.004415783 | | 81 |
| 11.75097357 | | −0.639416013 | 83 |
| 12.065881571 | −0.319639012 | | 85 |
| 12.06454556 | −0.002199891 | | 84 |
| 12.06677559 | | −0.637028781 | 86 |
| 12.38321024 | −0.31874541 | | 88 |
| 12.38217519 | −0.001247207 | | 87 |
| 12.700610757 | −0.318075569 | | 89 |
| 12.69981647 | −0.000578900 | | 90 |
| 12.701347219 | | −0.635698092 | 91 |

Figure 9:
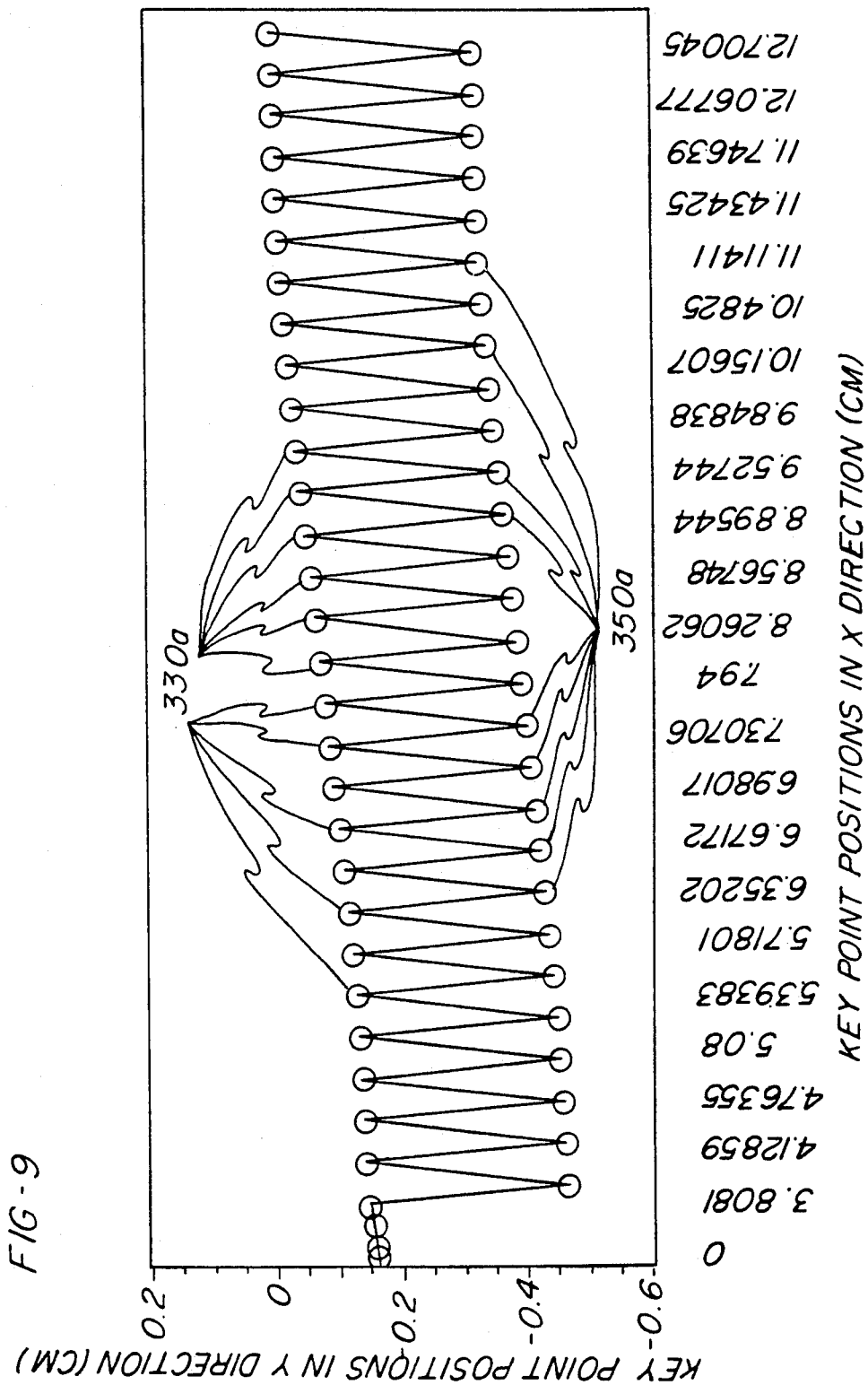
FIG. 9 is a graph depicting the degree of concavity of a backing plate adapted for water pressure loading of 30 psi at a variety of key points along its radius.

Turning now to FIG. 9, there is shown a graph representing location of some key points of the respective crests 330a and roots 350a of teeth 240 of the backing plate (in accordance with the preferred embodiment of FIG. 6) based upon presently available data. These data are representative of the ideal parabolic curvature location of the teeth 240 as they extend in rows 310 radially outwardly from the center of the backing plate 200. These data are relevant to situations encountered wherein the cooling fluid pressure on side 250 of the backing plate will be 30 psi. The data are related to a 10-inch diameter circular backing plate having a 1" thickness.

As shown at the center of the disc-like shape, crests 330a are formed so that they are about 0.16 cm spaced from the hypothetical plane represented by 0 in the y direction of the graph. Upon radial outward progression, the crests 330a approach the planar (y=0) position about 11.11 cm from the center. Roots 350a are milled about 0.3175 cm spaced from corresponding crests 330a. These data are representative of the substantially parabolic curvature imparted to surface 220 of the backing plate, in order to compensate for elastic bowing of same encountered, when cooling pressure of 30 psi is to be exerted upon surface 250 of the backing plate.

Figure 10:
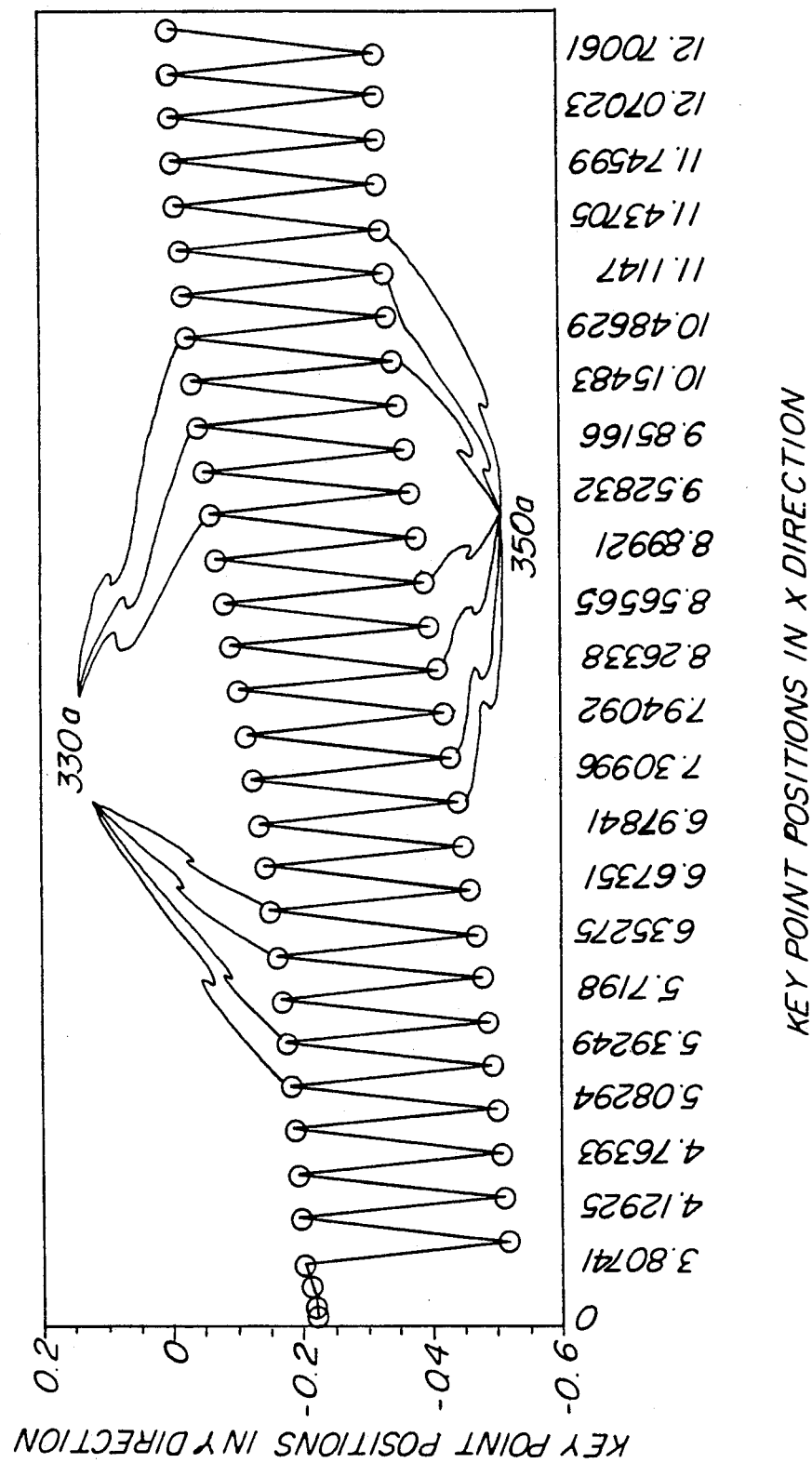
FIG. 10 is a graph depicting the degree of concavity of a backing plate adapted for water pressure loading of 45 psi at a variety of key points along its radius.

FIG. 10 is similar to the graph shown in FIG. 9, except that the key crest 330a and root 350a locations are given in relation to encountered cooling fluid pressures of 45 psi. As expected, the concave curvature of surface 220 is more pronounced than in the 30 psi cooling fluid pressure scenario. Here, crests 330a located at the center of the backing plate are spaced about 0.212 cm from planarity and progressively decrease in divergence from planarity upon increase in radial dimension. Planarity is approached at a radial distance of approximately 11.43 cm. Again, the roots are formed about 0.317 cm spaced from corresponding crests.

Of course, the skilled artisan will appreciate that the optical degree of concavity will vary depending upon water pressure encountered, backing plate construction, including metallurgical composition and size dimensions, and a variety of sputtering parameters. Suffice it to state here that the backing plates, in accordance with the preferred embodiment of the invention, can be viewed as having a substantially parabolic concavity in order to compensate for the distortion exerted thereon from the cooling fluid pressure.

Provision of a curved surface along the target-backing plate interface, and particularly on the front surface of the backing plate, as noted above, will greatly alleviate elastic deformational problems. However, the traditional use of oxygen-free copper (OFC) material for the backing plate material has also caused problems due to plastic deformation thereof upon operation of the cathode assembly. It is thought that this plastic deformation also occurs primarily due to the water pressure in the cooling jacket behind the backing plate. Plastic deformation is a permanent change in the shape or size of the backing plate without fracture resulting from the application of sustained stress (such as the water pressure), beyond the elastic limit of the material. I have found that significant improvement in performance with regard to amelioration of the bowing tendency attributed to plastic deformation may be achieved by providing a backing plate composed of a metal or alloy having a yield strength (ksi) of about 35 or greater. More particularly, a yield strength of about 45 or greater is preferred. Of course, the backing plate must possess sufficient thermal conductivity so as to effectively dissipate heat from the target during sputtering.

Accordingly, a Cu-Be (copper beryllium, C175000) alloy having a 45 ksi yield strength replaced the OFC backing plate and was tested by finite element analysis. The Cu-Be alloy backing plate was then tested under water pressures of 30 psi and 45 psi and released to determine the amount of plastic deformation. For both the 30 psi and 45 psi water pressure, the displacements of the Cu-Be backing plate were in the −16 or −15 exponential order range which are very small displacements. Therefore, plastic deformation concerns can be alleviated by providing a backing plate material having the above-noted yield strength.

One experimental program developed at present calculates the location of the cooling teeth 14 on the back surface 16 of the target 10 given the backing plate teeth 24 location, the thermal coefficient of expansion of the target material, the desired operating temperature and the depth of the backing plate teeth.

Although this invention has been described in connection with specific forms thereof, it will be appreciated by one reading the preceding description of the present invention that a wide variety of equivalents may be substituted for those specific elements and steps of operation shown and described herein, that certain features may be used independently of other features, all without departing from the spirit and scope of this invention as defined in the appended claims.

What is claimed is:

1. Cathode assembly for use in a cathodic sputter coating apparatus, said assembly including a backing plate in contact with a pressurized flow of cooling fluid and being deformable upon application of pressure thereto by said pressurized cooling fluid, a target member carrying material to be sputter coated; cooperating mating means connected to said target and said backing plate for coupling said target in heat exchange relation with said backing plate along a target-backing plate interface, said mating means further comprising coupling securing means in the form of a concave surface area located at said target/backing plate interface for inhibiting uncoupling of said mating means otherwise due to deformation of said backing plate said target comprising a top surface carrying said material to be sputter coated and a bottom surface, said backing plate comprising a top surface and a bottom surface in contact with said cooling fluid, said mating means comprising a first set of annularly disposed teeth formed on the bottom surface of said target and a second set of annularly disposed teeth formed on said top surface of said backing plate for engaging said first set of teeth, said concave surface being provided as said top surface of said backing plate, said first set of teeth comprising teeth having a normal wall member extending normal to said target bottom surface and an inclined wall connected to said normal wall member at an acute angle, said second set of annularly disposed teeth each comprising a normal wall member extending normal to said backing plate top surface and an inclined wall connected to said normal wall member at an acute angle, said first and second sets of teeth each being concentrically arranged as a plurality of annularly disposed neighboring rows of teeth formed in said target and backing plate, respectively, at room temperature, the distance from normal wall to normal wall of neighboring rows of said first set of teeth being slightly less than the distance from normal wall to normal wall on said second set of teeth.

2. Cathode assembly as recited in claim 1 wherein said backing plate is composed of a heat conductive metal or metal alloy having a yield strength of about 35 ksi or greater.

3. Cathode assembly as recited in claim 2 wherein said backing plate metal or metal alloy has a yield strength of about 45 ksi or greater.

4. Cathode assembly as recited in claim 3 wherein said backing plate is composed of copper-beryllium alloy.

5. Cathode assembly as recited in claim 1 wherein said concave surface comprises a dish-like concavity.

6. Cathode assembly as recited in claim 5 wherein said concavity is substantially parabolic.

7. A backing plate for use in a cathode assembly of a cathodic sputter coating apparatus, said apparatus comprising a target member having a first side carrying matter to be deposited by said sputter coating and an opposed second side including a plurality of annularly arranged teeth for mounting to said backing plate, said backing plate comprising a top surface including a plurality of annularly arranged teeth for matingly engaging said teeth on said target and a second opposed surface adapted for contact with a pressurized flow of cooling fluid, said backing plate top surface comprising a concave surface adapted to compensate for distortion of said backing plate by said pressurized flow of cooling fluid said concave surface being substantially dish like in curvature wherein said curvature is substantially parabolic, said backing plate teeth each comprising a normal wall member extending normal to said backing plate top surface and an inclined wall connected to said normal wall member at an acute angle.

8. Backing plate as recited in claim 7 composed of a heat conductive metal or metal alloy having a yield strength of 35 ksi or greater.

9. Backing plate as recited in claim 8 wherein said metal or metal alloy has a yield strength of about 45 ksi or greater.

10. Backing plate as recited in claim 9 composed of copper-beryllium alloy.

11. Backing plate as recited in claim 7 wherein said backing plate teeth comprise a plurality of annularly disposed rows of teeth.

12. Backing plate as recited in claim 11 wherein said rows of teeth are concentrically disposed on said backing plate top surface.

13. A target for use in a cathode assembly of a cathodic sputter coating apparatus, said apparatus comprising a backing plate having a top surface portion for mounting of said target thereon and a bottom surface portion in contact with a pressurized flow of cooling fluid, said target comprising a top surface carrying material to be deposited by said sputter coating and an opposed second side including a plurality of annularly arranged teeth for mounting to said backing plate, said target second side comprising a dish-like concavity for mounting on said backing plate top surface portion, said annularly arranged target teeth comprising a plurality of annularly disposed rows of teeth, said rows being concentrically arranged on said target second side, said teeth each comprising a normal wall member extending normal to said target second side and an inclined wall connected to said normal wall member at an acute angle.

14. Target as recited in claim 13 composed of aluminum or aluminum alloy.

15. Target as recited in claim 13 wherein said concavity is substantially parabolic in curvature.

* * * * *